United States Patent
Mahowald

(10) Patent No.: US 7,573,126 B2
(45) Date of Patent: Aug. 11, 2009

(54) MATCHING CIRCUITS ON OPTOELECTRONIC DEVICES

(75) Inventor: Peter Henry Mahowald, Los Altos, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 10 days.

(21) Appl. No.: 11/753,270

(22) Filed: May 24, 2007

(65) Prior Publication Data

US 2007/0278636 A1    Dec. 6, 2007

Related U.S. Application Data

(62) Division of application No. 10/697,064, filed on Oct. 30, 2003, now Pat. No. 7,227,246.

(51) Int. Cl.
*H01L 23/64* (2006.01)
*H01L 23/58* (2006.01)
*G09G 3/32* (2006.01)
*H04B 10/02* (2006.01)

(52) U.S. Cl. ............... 257/678; 257/E23.079; 257/E31.054; 257/E25.015; 257/E23.062; 257/E29.116; 257/349; 257/80; 257/81; 257/138; 365/200; 345/82; 330/308; 330/110; 330/282; 330/289

(58) Field of Classification Search ......... 257/678, 257/E23.079, E31.054, E25.015, E23.062, 257/E29.116, 349, 80, 81, 138; 365/20; 345/82; 330/308, 110.282, 289
See application file for complete search history.

(56) References Cited

U.S. PATENT DOCUMENTS

| | | | |
|---|---|---|---|
| 4,813,045 A | 3/1989 | Culpepper | |
| 5,036,517 A | 7/1991 | Meyers | |
| 6,067,307 A | 5/2000 | Krishnamoorthy | |
| 6,101,295 A | 8/2000 | Mineo et al. | |
| 6,437,899 B1 | 8/2002 | Noda | |
| 6,448,860 B1 | 9/2002 | Wolter et al. | |
| 6,583,445 B1 | 6/2003 | Reedy et al. | |
| 6,639,461 B1 | 10/2003 | Tam et al. | |
| 6,706,546 B2 | 3/2004 | Yoshimura et al. | |
| 6,841,815 B2 | 1/2005 | Nguyen et al. | |
| 7,049,759 B2 * | 5/2006 | Roach ............. | 315/224 |
| 2002/0195662 A1 | 12/2002 | Eden et al. | |
| 2003/0122628 A1 | 7/2003 | Aikawa et al. | |
| 2007/0278636 A1 * | 12/2007 | Mahowald ............ | 257/678 |
| 2008/0049799 A1 * | 2/2008 | Bozso et al. ......... | 372/38.02 |

* cited by examiner

*Primary Examiner*—Alexander O Williams

(57) ABSTRACT

The present invention alters the frequency response of an optoelectronic device to match a driver circuit that drives the optoelectronic device. The optoelectronic device is formed on a first substrate. A matching circuit is also formed on the first substrate and coupled to the optoelectronic device to change its frequency response. The matching circuit provides a precise and repeatable amount of inductance to an optoelectronic device.

7 Claims, 5 Drawing Sheets

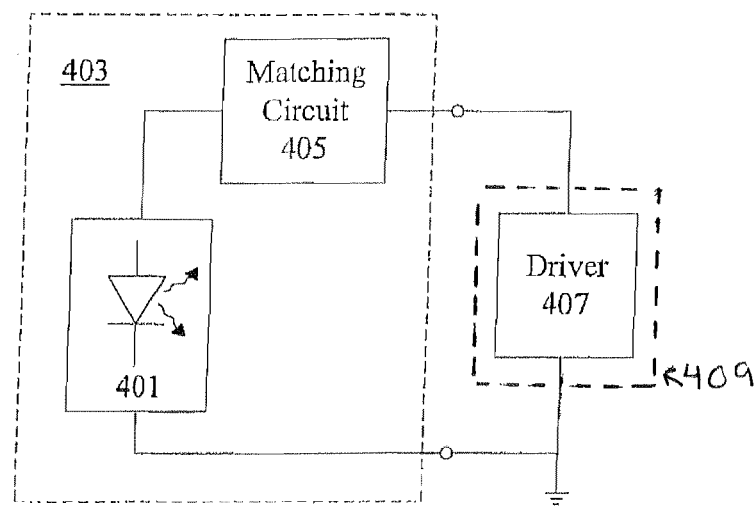
Figure 4
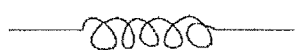 
Figure 5A                Figure 5B
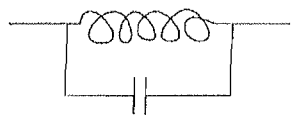 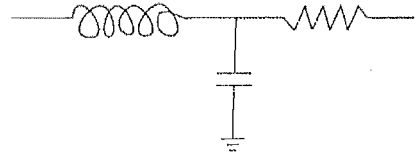
Figure 5C                Figure 5D

MATCHING CIRCUITS ON OPTOELECTRONIC DEVICES

CROSS-REFERENCE TO RELATED APPLICATIONS

This is a Divisional application of application Ser. No. 10/697,064, filed on Oct. 30, 2003, the entire disclosure of which is incorporated herein by reference. The application Ser. No. 10/697,064 is now a U.S. Pat. No. 7,227,246.

BACKGROUND OF THE INVENTION

An optical transceiver transmits and receives light signals within a fiber optic network. The light source for the transceiver is typically an optoelectronic device, such as a Vertical Cavity Surface Emitting Laser (VCSEL), a Light Emitting Diode (LED), a laser, or other light-emitting device. The light output from the optoelectronic device is controlled by a driver circuit.

In digital transmissions, the driver circuit drives the optoelectronic device between high and low signal outputs to represent a digital data stream. The data is synchronized to a clock with a regular period. During a certain window of time during each clock cycle, the transmitted signal must clearly be a one or zero for the receiver to read the data correctly. Any signal transitions are done outside this window. When plotted on an oscilloscope, the transmitted signal looks like the graph in FIG. 1, known as an eye diagram. A transceiver with optimal performance has fast rise and fall times in its eye diagram without excessive ringing in the output.

The optoelectronic device and the driver circuit are typically formed as separate components on separate chips. There are several options for electrically connecting the optoelectronic device to the driver circuit. FIG. 2A shows one method, wherein a bond pad on the optoelectronic device 203 is connected to a bond pad on the driver circuit 205 with a conductive wire bond 207. FIG. 3A shows another method, known as a flip-chip configuration: the chip with the optoelectronic device 303 is flipped onto the chip with the driver circuit 305, and bond pads on the two chips are bonded together using solder balls 307. There are many other configurations for bonding the two chips together.

Since the data rate within optical networks is constantly increasing, the transitions between high and low outputs must occur faster and faster. However, the effect of parasitic capacitances and inductances within the transceiver becomes more pronounced as the transmission frequency increases, which negatively affects the performance of the transceiver.

For example, the wire bond connection 207 of FIG. 2A introduces inductance between the optoelectronic device 103 and the driver circuit 105, which changes the frequency response of the transceiver. Unfortunately, the size and shape of the wire bonds are not consistent: some wires may arc higher than others, and some wires may be shorter than others. Therefore, the inductance of each wire bond will vary as well. This variability lowers the manufacturing yield, because the frequency response of the transceiver may no longer meet specifications. FIG. 2B shows a sample eye diagram for an optical transceiver with excessive inductance in the wire bonds between the optoelectronic device and the driver circuit. The ringing effect in the transmitted signal makes it difficult for the receiver to determine whether the data is a one or a zero.

The flip-chip construction of FIG. 3A is also problematic. Since the solder balls 307 are relatively small, they introduce very little inductance into the system. However, a connection with too little inductance may also negatively affect the frequency response of the optical transceiver. FIG. 3B shows a sample eye diagram for an optical transceiver having too little inductance (which manifests itself in the signal as insufficient response peaking) in the wire bonds between the optoelectronic device and the driver circuit. The transmitted signal takes much longer to complete its transitions, which slows down the speed at which data can be transmitted.

Past attempts to compensate for these problems included redesigning the driver circuit, redesigning the bond pads, adjusting the length of the wire bond, or changing the arc of the wire. However, these methods are time-consuming, expensive, and difficult to repeat. Therefore, there remains a need for a way to electrically connect an optoelectronic device to a driver circuit to produce an optical transceiver with an optimal frequency response, and to do so with higher yield and better repeatability.

SUMMARY OF THE INVENTION

In a preferred embodiment of the present invention, the invention provides a precise and repeatable amount of inductance or capacitance to the optoelectronic device. A matching circuit is formed on the same substrate as the optoelectronic device. The matching circuit alters the frequency response of the optoelectronic device to match a driver circuit that drives the optoelectronic device. Thus, the optical transceiver can produce optimal performance within a desired frequency range.

The matching circuit adds a precise amount of inductance, capacitance, or a combination of both to alter the frequency response of the optoelectronic device. A flip-chip configuration is used to bond the optoelectronic device to the driver circuit, because the solder balls introduce only a negligible amount of parasitic capacitance and inductance into the system. Thus, variability in the parasitics from the bonding mechanism is eliminated.

The matching circuit can be a simple inductor, an inductor in series with a capacitor, an inductor in parallel with a capacitor, or any other possible combination of inductors and capacitors. Multiple stages of these inductor and capacitor combinations may also be used in the matching circuit. The inductance or capacitance in the matching circuit can be precisely calculated and designed to optimize the performance of the optical transceiver. Other components such as resistors, diodes, and stubs, may also be incorporated into the matching circuit.

In an alternate embodiment, the matching circuit can be altered after fabrication to change the frequency response of the optoelectronic device. The substrate of the optoelectronic device is designed with two bond pads as possible contact points to the matching circuit. Each bond pad is connected to a different amount of inductance. This configuration provides some flexibility in the amount of inductance that may be introduced into a system, since the decision as to how much inductance is introduced may be delayed until after the fabrication of the matching circuit.

In an alternate embodiment, the optoelectronic device is a photosensor. The performance of a photosensor is also dependent upon operating frequency, since it is also susceptible to parasitic inductances and capacitances. Therefore, a matching circuit can be used to tune the frequency response of a photosensor as well to match the frequency response of the photosensor to an amplifier.

Further features and advantages of the present invention, as well as the structure and operation of preferred embodiments of the present invention, are described in detail below with reference to the accompanying exemplary drawings.

BRIEF DESCRIPTION OF THE DRAWINGS

FIG. 4 shows a high-level block diagram of a preferred embodiment made in accordance with the teachings of the present invention.

FIGS. 5A-5D show possible circuit configurations for the matching circuit.

DETAILED DESCRIPTION

Figure 1:
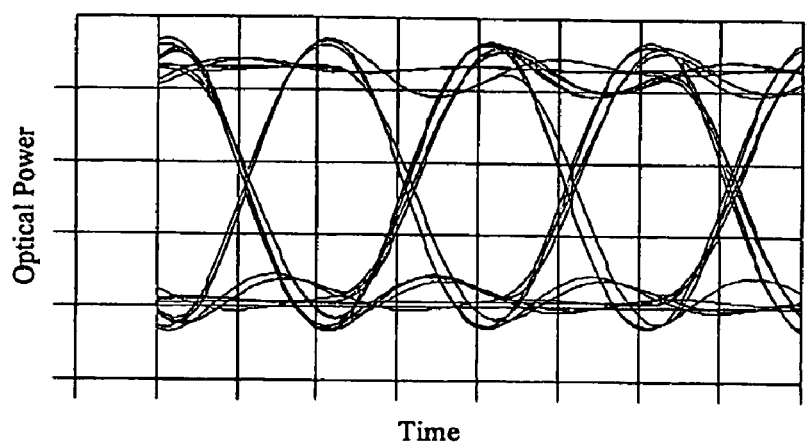
FIG. 1 is an eye diagram for an optical transceiver.
Figure 2A:
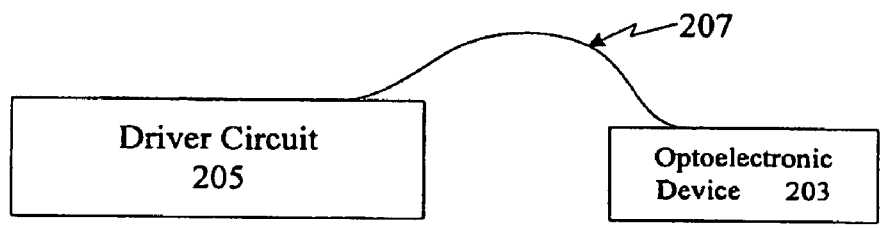
FIG. 2A shows an optoelectronic device and a driver circuit connected by a wire bond.
Figure 2B:
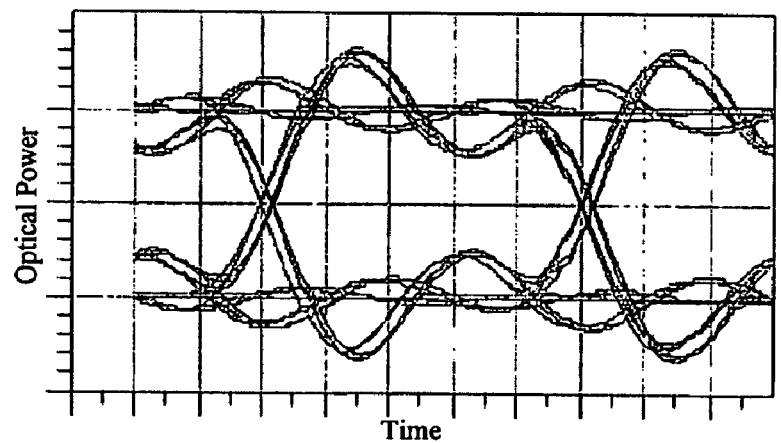
FIG. 2B shows a sample eye diagram for an optical transceiver with excessive inductance in the wire bonds between the optoelectronic device and the driver circuit.
Figure 3A:
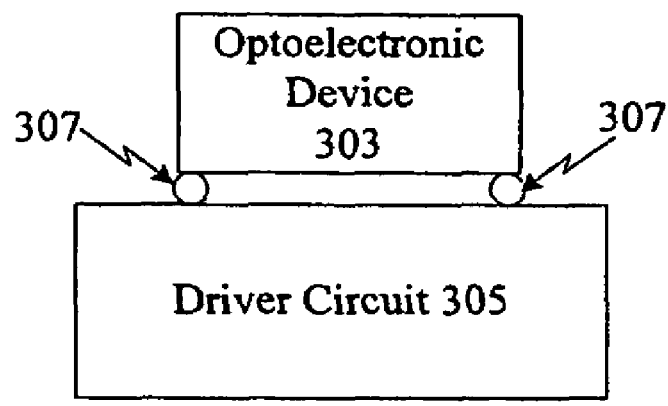
FIG. 3A shows a flip-chip configuration for bonding an optoelectronic device to a driver circuit.
Figure 3B:
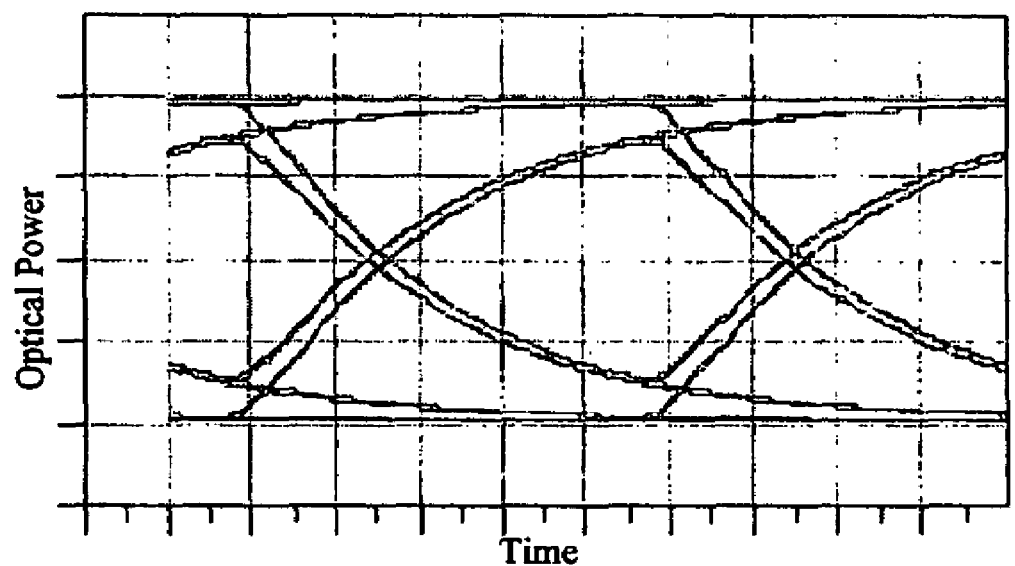
FIG. 3B shows a sample eye diagram for an optical transceiver having too little inductance (which manifests itself in the signal as insufficient response peaking) in the wire bonds between the optoelectronic device and the driver circuit.

FIG. 4 shows a high-level block diagram of a preferred embodiment made in accordance with the teachings of the present invention. An optoelectronic device 401 is formed upon a first substrate 403. A matching circuit 405 is formed upon the first substrate 403 and coupled to the optoelectronic device 401. A driver circuit 407, formed on a second substrate 409, controls the output of the optoelectronic device 401. The matching circuit 405 is designed to tune the frequency response of the optoelectronic device 401 to the driver circuit 407 for optimal performance within a desired frequency range.

The matching circuit 405 introduces a precise amount of inductance, capacitance, or both to alter the frequency response of the optoelectronic device 401. The actual amount of inductance or capacitance required to produce an optimal performance may be determined empirically through circuit simulations.

FIGS. 5A-5D show possible circuit configurations for the matching circuit 405. The matching circuit 405 can be a simple inductor (FIG. 5A), an inductor in series with a capacitor (FIG. 5B), an inductor in parallel with a capacitor (FIG. 5C), or any other possible combination of inductors and capacitors. Multiple stages of these inductor and capacitor combinations may also be used in the matching circuit 405. Other components such as resistors, diodes and stubs, may also be incorporated into the matching circuit 405. FIG. 5D, for instance, shows an inductor in series with an RC filter.

Figure 6:
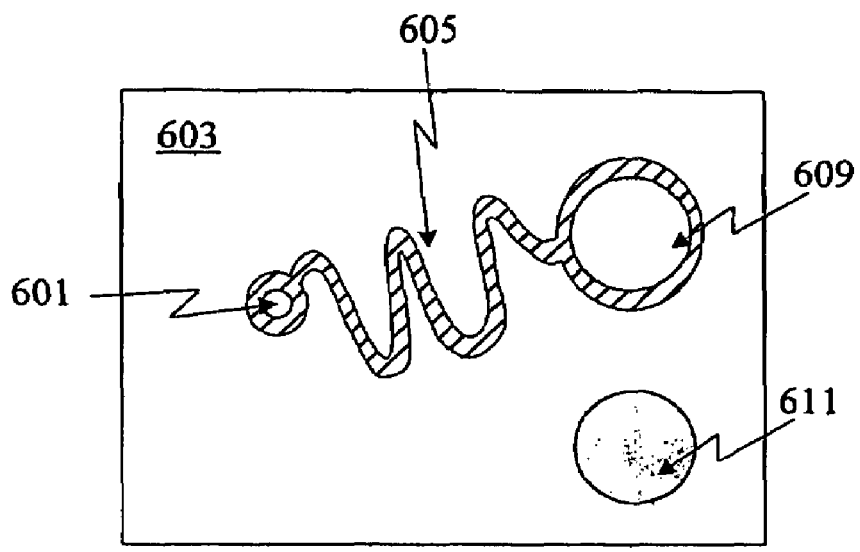
FIG. 6 shows a top view of a VCSEL and an inductor formed on the VCSEL substrate.

In a preferred embodiment of the present invention, the matching circuit is a simple inductor. FIG. 6 shows a top view of a VCSEL 601 and an inductor 605 formed on the VCSEL substrate 603, made in accordance with the teachings of the present invention. Although a VCSEL is shown in this particular illustration, other optoelectronic devices may also be used. The VCSEL 601 is formed on a substrate 603. Two bond pads, 609 & 611, are provided on the substrate 603 for connecting a driver circuit 607 (not shown) to the anode and cathode of the VCSEL 601 in order to bias and control the VCSEL 601. The inductor 605 is also formed on top of the same substrate 603, using any conventional photolithographic process. The inductor 605 connects the VCSEL 601 to the bond pad 609.

The inductor 605 can be formed with any suitable conductive material such as copper, aluminum, gold, etc. The shape, length and width of the inductor 605 may be varied to control the amount of inductance. The inductor 605 is formed over a low-loss insulating layer on the substrate 603 to prevent accidental shorting to any other circuits within the substrate 603. Exemplary low-loss insulating materials include lightly doped silicon, polyimide, silicon dioxide, silicon nitride, and other dielectrics.

The optoelectronic device 601 is flipped onto the surface of the chip holding the driver circuit (not shown) and bonded in a flip-chip configuration. Since the solder balls used in the flip chip configuration introduce a minimal amount of inductance and capacitance into the system, the inductor 605 provides the frequency response adjustment for the optical transceiver. The design of the inductor 605 is flexible; the amount of inductance can be changed to match other chip bonding configurations as well.

Figure 7:
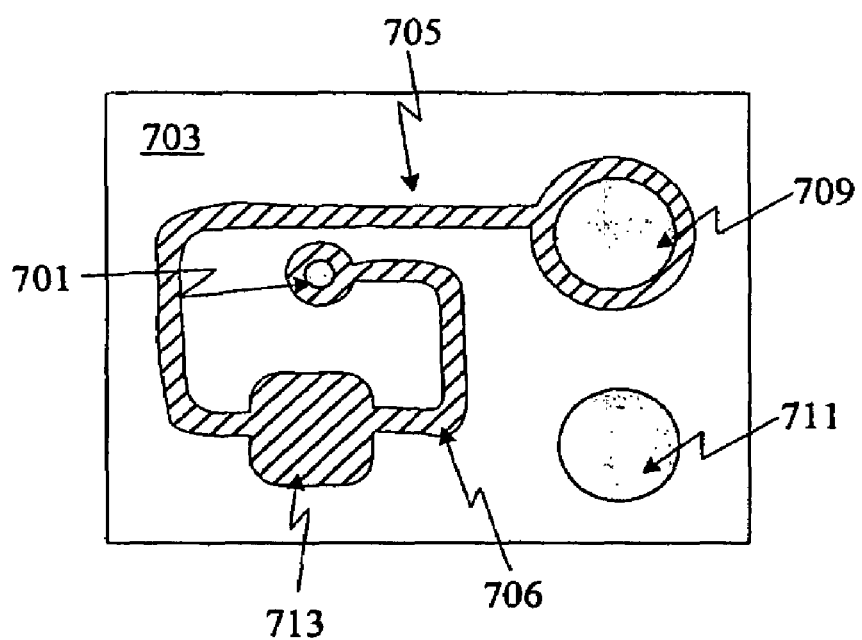
FIG. 7 shows an alternate embodiment for the matching circuit.

In an alternate embodiment, the matching circuit can be a combination of inductors, capacitors, resistors, stubs, and other matching devices. For example, FIG. 7 illustrates a top view of a VCSEL 701 and a matching circuit formed on a substrate 703, made in accordance with the teachings of the present invention. The matching circuit in FIG. 7 consists of two inductors 705 and 706 in series with a capacitor 713. Again, although a VCSEL is shown in this particular illustration, other optoelectronic devices may also be used. A wide variety of configurations and combinations of matching devices are possible. Two bond pads, 709 and 711, are provided on the substrate 703 for connecting a driver circuit 707 (not shown) to the anode and cathode of the VCSEL 701 in order to bias and control the VCSEL 701.

Figure 8:
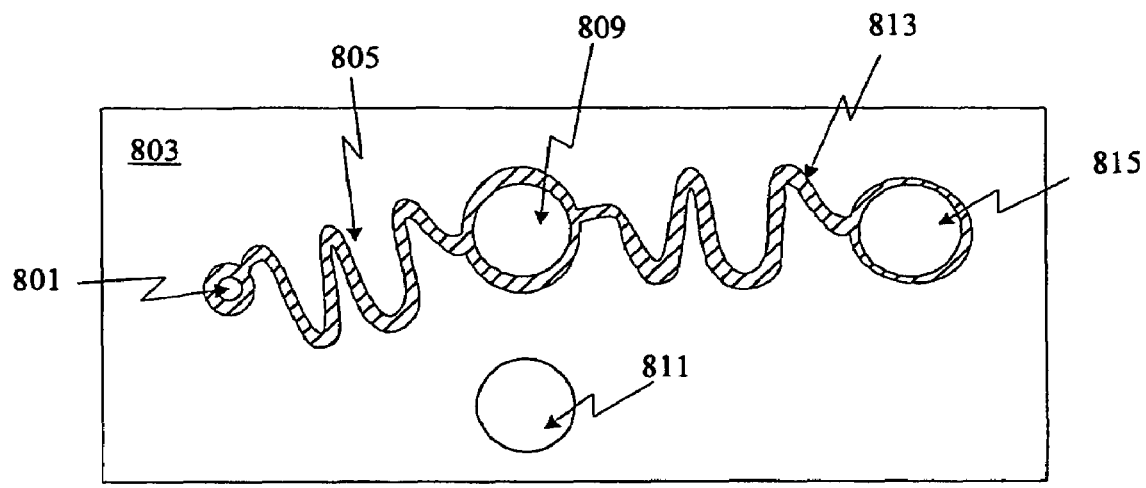
FIG. 8 shows a possible configuration for altering the frequency response of the optoelectronic device, after it has been fabricated.

In a second alternate embodiment, the matching circuit can be altered after fabrication to change the frequency response of the optoelectronic device. In FIG. 8, the VCSEL 801 is designed with two possible contact points to the matching circuit-bond pads 809 and 815. A driver circuit bonded to the first bond pad 809 will only be connected to inductor 805. A driver circuit bonded to the second bond pad 815 will be connected to both inductors 805 and 813. This configuration provides some flexibility in the amount of inductance that may be introduced into a system, since the decision as to how much inductance is introduced may be delayed until after the fabrication of the matching circuit. Two bond pads, 809 and 815, are provided on the substrate 803 for connecting a driver circuit 807 (not shown) to the anode of the VCSEL 801. Bond pad 811 is provided on the substrate 803 for connecting a driver circuit 807 (not shown) to the cathode of the VCSEL 801 in order to bias and control the VCSEL 801.

Figure 9:
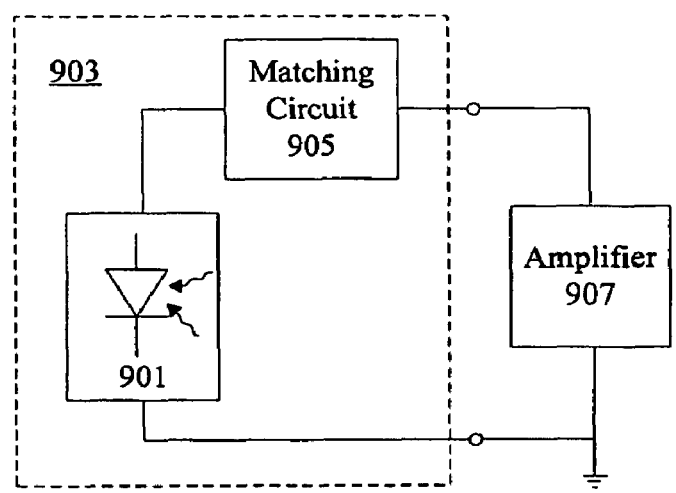
FIG. 9 shows an alternate embodiment in which the matching circuit is used to tune the frequency response of a photosensor.

FIG. 9 shows a third alternate embodiment in which the optoelectronic device is a photosensor 901, such as a PIN (P-type Intrinsic N-type) detector or a photodiode. The performance of the photosensor 901 is also dependent upon operating frequency, since it is also susceptible to parasitic inductances and capacitances Therefore, a matching circuit 905 can be used to tune the frequency response of a photosensor 901 as well. The matching circuit 905 is fabricated on the same substrate 903 as the photosensor 901 and matches the frequency response of the photosensor 901 to an amplifier 907. The amplifier 907 amplifies the signals from the photosensor 901.

Although the present invention has been described in detail with reference to particular preferred embodiments, persons possessing ordinary skill in the art to which this invention pertains will appreciate that various modifications and enhancements may be made without departing from the spirit and scope of the claims that follow.

I claim:

1. An apparatus comprising:
   a first substrate;
   an optoelectronic device formed on the first substrate, the optoelectronic device having a frequency response;
   a matching circuit formed on the first substrate and coupled to the optoelectronic device to change its frequency response;
   a driver circuit that communicates with and controls the optoelectronic device;
   a second substrate, wherein the driver circuit is formed on the second substrate;
   wherein the matching circuit is selected to match the frequency response of the optoelectronic device to the drive circuit for optimal performance;
   wherein the optoelectronic device is flip-chip mounted to an auxiliary circuit.

2. An apparatus comprising:
   a first substrate;
   an optoelectronic device formed on the first substrate, the optoelectronic device having a frequency response;
   a matching circuit formed on the first substrate and couple to the optoelectronic device to change its frequency response;
   a driver circuit that communicates with and controls the optoelectronic device;
   wherein the driver comprises an amplifier that communicates with and amplifies a signal from the optoelectronic device.

3. The apparatus as in claim 2, further comprising:
   a second substrate, wherein the amplifier if formed on the second substrate.

4. The apparatus as in claim 3, wherein the matching circuit is selected to match the frequency response of the optoelectronic device to the amplifier for optimal performance.

5. The apparatus as in claim 4, where in the matching circuit includes a passive device consisting from the group consisting of inductors, capacitors, resistors, stubs, and diodes.

6. The apparatus as in claim 5, wherein the optoelectronic device is a photosensor.

7. The apparatus as in claim 6, wherein the photosensor is flip-chip mounted to the amplifier.

* * * * *